(12) United States Patent
Baxter (10) Patent No.: US 7,040,009 B2
(45) Date of Patent: May 9, 2006

(54) HEAT SINK HAND PLACEMENT TOOL

(75) Inventor: Michael S. Baxter, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 405 days.

(21) Appl. No.: 10/611,554

(22) Filed: Jun. 30, 2003

(65) Prior Publication Data
US 2004/0068866 A1   Apr. 15, 2004

Related U.S. Application Data

(60) Provisional application No. 60/394,590, filed on Jul. 9, 2002.

(51) Int. Cl.
*B23P 19/00*   (2006.01)

(52) U.S. Cl. .................. 29/762; 29/402.03; 29/402.11; 29/426.1; 29/426.3; 29/426.5

(58) Field of Classification Search .................. 29/739, 29/740, 741, 832, 402.03, 402.08, 402.11, 29/426.1, 426.3, 426.5, 762
See application file for complete search history.

(56) References Cited

U.S. PATENT DOCUMENTS

| | | | | |
|---|---|---|---|---|
| 4,970,779 A * | 11/1990 | Chen | ........................... | 29/764 |
| 5,224,263 A * | 7/1993 | Hamburgen | .................. | 29/762 |
| 5,329,693 A * | 7/1994 | Smith | ........................... | 29/764 |
| 5,375,319 A * | 12/1994 | Jacobs | ........................ | 29/762 |
| 5,579,571 A * | 12/1996 | Park et al. | ..................... | 29/762 |
| 5,842,261 A * | 12/1998 | Ortiz | ........................ | 29/426.5 |
| 6,202,294 B1 * | 3/2001 | Bogannam | .................... | 29/764 |
| 6,219,905 B1 * | 4/2001 | Bollesen | ....................... | 29/764 |
| 6,779,256 B1 * | 8/2004 | Kappel et al. | ................ | 29/764 |
| 6,915,563 B1 * | 7/2005 | Bolde et al. | ................. | 29/762 |

\* cited by examiner

*Primary Examiner*—Rick Kiltae Chang
(74) *Attorney, Agent, or Firm*—Moser, Patterson, Sheridan LLP; Thomas F. Lenihan (57) ABSTRACT

A heat sink hand placement tool for manually installing a heat sink to an integrated circuit (IC). The heat sink tool includes a heat sink interface block having a lower surface adapted to provide a force on a heat sink disposed over an IC. A force transducer interfaces with an upper surface of the heat sink interface block to produce an electrical signal, which is routed to a measurement circuit to measure the electrical signal. A chassis is disposed over the force transducer and the measurement circuit, wherein the chassis is adapted to receive a force from a user, such that the force is transmitted to the lower surface of the heat sink interface block. The measurement circuit then provides an indication of the force being applied within a predetermined range.

7 Claims, 6 Drawing Sheets

HEAT SINK HAND PLACEMENT TOOL

CROSS-REFERENCE TO RELATED APPLICATIONS

This patent application claims the benefit of U.S. Provisional Application Ser. No. 60/394,590, filed Jul. 9, 2002, which is incorporated by reference herein in its entirety.

FIELD OF INVENTION

The present invention relates in general to a hand-held tool, and more specifically, to a tool for installing heat sinks on integrated circuits.

BACKGROUND OF INVENTION

Effective cooling of electronic parts found inside many products used today helps insure the reliability and proper function of these products. Heat sinks are commonly used to dissipate heat generated by such electronic parts. The heat sinks provide additional surface area, illustratively, through fins or pins on an upper surface of the heat sink to conduct heat away from an integrated circuit (IC). That is, the heat sink radiates the heat via the illustrative fins or pins to the surrounding environment.

A heat sink may be affixed to an upper surface of an IC by various techniques, such as mechanical devices (e.g., mounting clips), or by bonding the bottom surface of the heat sink to the upper surface of the IC. For example, one type of heat sink is provided with an adhesive tape affixed to the bottom of the heat sink. The adhesive tape is inexpensive and easy to use. However, the process of bonding of the heat sink to the IC may cause variability in product reliability and functionality.

For example, in non-automated integration and manufacturing facilities, heat sinks may be installed over an IC manually by a technician. In particular, the technician places the heat sink over the IC and exerts a downward force on the heat sink to secure the heat sink to the upper surface of the IC via the bonding material (e.g., adhesive tape). If the technician does not apply ample force to the upper surface of the heat sink, the adhesive may not securely affix to the upper surface of the IC, and may be susceptible to falling off the IC, illustratively, during shipping and/or handling of the product. Conversely, the technician may exert an excessive downward force on the heat sink, which may damage the IC or the surrounding components, such as solder connections and/or the printed circuit board supporting the IC.

Additionally the duration of the force applied by the technician significantly affects the quality of the tape bond. For proper bonding, the force must be applied for a known minimum duration. Therefore, there is a need in the art for a hand-held tool that minimizes the variability in magnitude of applied force and its duration when installing a heat sink having a bonding material, such as adhesive tape, to the surface of the IC.

SUMMARY OF THE INVENTION

The disadvantages discussed above may be overcome by the present invention of a heat sink hand placement tool for manually installing a heat sink onto an integrated circuit (IC). The heat sink tool includes a heat sink interface block having a lower surface adapted to provide a force on a heat sink disposed over an IC. A force transducer interfaces with a rod that is connected to the heat sink interface block to produce an electrical signal. This electrical signal is measured by circuitry that provides feedback to the user indicating proper placement of the heat sink.

A chassis is disposed over the force transducer and the measurement circuitry, wherein the chassis is adapted to receive a force from a user, such that the force is transmitted to the lower surface of the heat sink interface block. Additionally, the chassis and force transducer are designed to transmit torque to the heat sink interface block. This allows the tool to be used for slight agitation, or slight back-and-forth twisting, during force application.

In one embodiment, the transducer includes a cantilever beam having a pair of strain gauges affixed on opposing sides of the cantilever beam. Electrically, the strain gauges also form a part of a wheatstone bridge of the measurement circuit. When the cantilever beam deflects from the applied force, the resistances of the strain gauges change, thereby generating a voltage difference across the output of the Wheatstone bridge. The output of the Wheatstone bridge is coupled to at least one comparator having a predetermined voltage threshold setting corresponding to a particular applied force. Once the predetermined voltage threshold is exceeded, the comparator turns on a respective force indicator, thereby signifying that an appropriate force is being applied to the heat sink. To indicate the proper duration of the applied force the output from the force transducer is used to enable a timer. After a set duration, the timer illuminates an indicator.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The present invention is a heat sink hand placement tool suitable for use by a technician for manually affixing a heat sink to an upper surface of an integrated circuit (IC). As discussed below in further detail, the heat sink hand placement tool of the present invention allows the user to affix a heat sink onto an IC by applying a force within a predetermined range for a predetermined time period. The predetermined range of the force and the predetermined time period for applying the force ensures that the heat sink will be properly affixed to the IC. Thus, the detrimental effects of exerting too much pressure, which may damage the solder connections of the IC, or not exerting enough pressure, which may result in the heat sink falling off and causing collateral damage, illustratively during shipping and handling, may be avoided.

Figure 1:
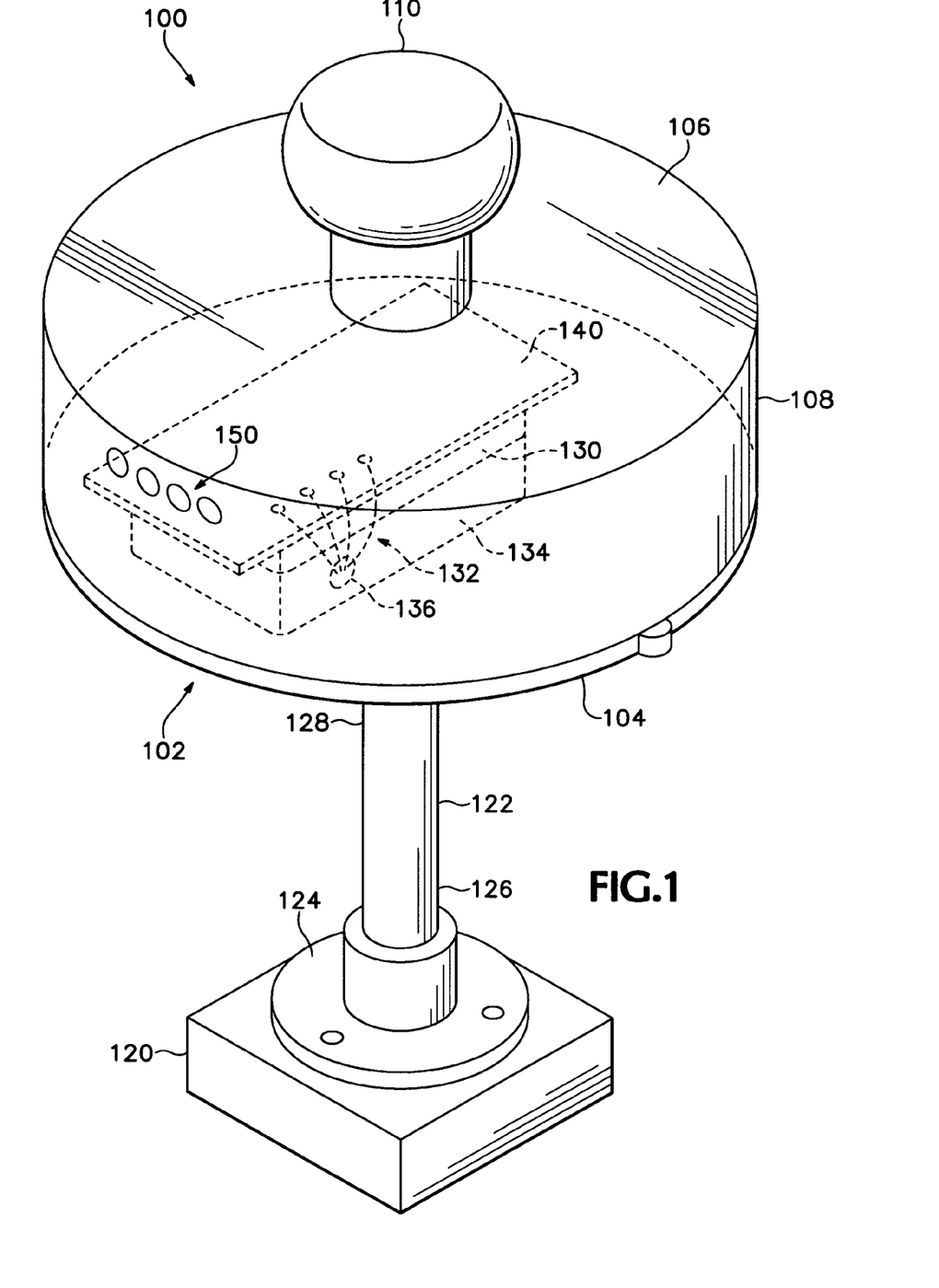
FIG. 1 depicts an isometric view of a heat sink hand placement tool of the present invention.

FIG. 1 depicts an isometric view of a heat sink hand placement tool 100 of the present invention. The heat sink hand placement tool (hereinafter "heat sink tool") 100 comprises a chassis 102, a heat sink interface block 120, a force transducer 130, a measurement and control circuit 140, and at least one force indicator 150. The chassis 102 comprises a lower plate 104, an upper surface 106, and at least one sidewall 108. In the embodiment shown in FIG. 1, the chassis 102 is cylindrical in shape, and is fabricated from an electrostatic discharge (ESD) safe material such as an ultra high molecular weight (UHMW) plastic. The UHMW plastic is a relatively inexpensive and ESD safe material that is easily machined during fabrication. One skilled in the art will appreciate that other ESD safe materials may be used, and the UHMW plastic material should not be considered as being limiting.

The chassis 102 facilitates housing the force transducer 130 and measurement and control circuit 140, and at least one force indicator, such as one or more light emitting diodes 150. As will be discussed below in further detail, the light emitting diodes 150 may be color-coded to represent various parameters (i.e., a predetermined force range, a time interval, a battery voltage indicator, among others). Furthermore, the chassis is sized to accommodate a users hand, such that a user may grasp the chassis 102. In one embodiment, a knob or handle 110 is provided on the upper surface 106 of the chassis 102 to enable a user to grasp the heat sink tool 100 and apply a force (e.g., a downward force).

Figure 2:
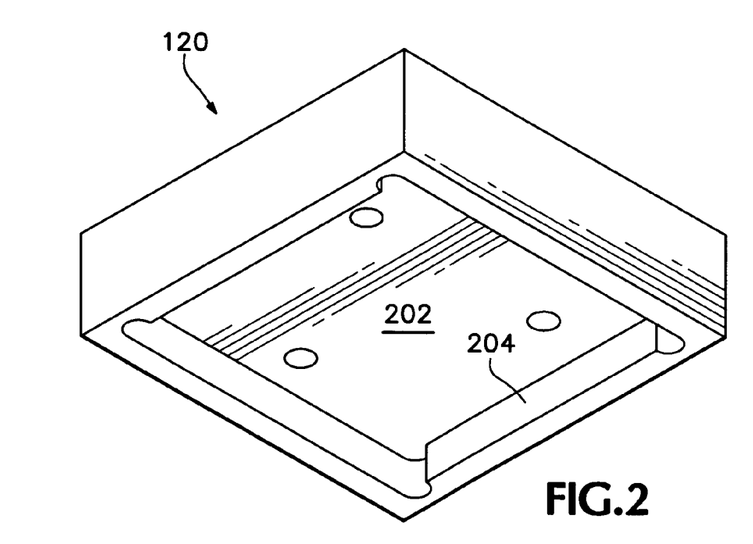
FIG. 2 depicts an isometric view of an exemplary heat sink interface block suitable for use with the heat sink tool of FIG. 1.

FIG. 2 depicts an isometric view of an exemplary heat sink interface block suitable for use with the heat sink hand placement tool of FIG. 1. The heat sink interface block 120 comprises a bottom surface 202 and a plurality of sidewalls 204 extending substantially perpendicular from the bottom surface 202.

The heat sink interface block 120 is sized to fit around the circumference of a heat sink, for example, a 1", 1 3/16", or 1 1/4" square heat sink, among other sized heat sinks. Although FIG. 2 depicts a square heat sink interface block 120, a person skilled in the art will appreciate that other sized and shaped heat sink interface blocks may also be utilized, which conform to a particular size and shape of the heat sink. It is noted that the heat sink interface block 120 may be fabricated from a rigid material such as aluminum, plastic, among other ESD safe materials.

Referring to FIG. 1, the heat sink interface block 120 is coupled to the lower plate 104 of the chassis 102 via an extension rod 122. The extension rod 122 separates the heat sink interface block 120 from the chassis 102 a distance (e.g., 2–4") to allow the user to see the placement of the heat sink hand placement tool 100 over a heat sink during installation. In particular, the extension rod 122 comprises a first end 126 and a second end 128. The first end 126 of the extension rod is adapted for coupling to the heat sink interface block 120, while the second end 128 is adapted for coupling to the force transducer 130 within the chassis 102.

In one embodiment the first end 126 of the extension rod 122 comprises a conventional male socket (e.g., such as a 1/4" or 3/8" socket extension having a friction ball), which may be removably inserted into a respective 1/4" or 3/8" female socket formed in the upper surface of the heat sink interface block 120. In one embodiment, the heat sink interface block 120 includes a female socket adaptor 124 coupled to the upper surface of the heat sink interface block 120. Alternatively, the female socket may be formed in the upper surface of the heat sink interface block 120. In either embodiment, the socket coupling allows different sized heat sink interface blocks 120 to be securely attached and easily replaced to accommodate different sized heat sinks, while also allowing torque transmission. A person skilled in the art will appreciate that other fastening techniques may be utilized to secure the heat sink interface block 120 to the extension rod 122, such as clips, screws, taps, bonding materials, among others.

The second end 128 of the extension rod 122 interfaces with the force transducer 130 to convert a mechanical action into an electrical signal, as discussed below in further detail. Specifically, the electrical signals are transferred via a plurality of wires 132 to the measurement and control circuit 140, which is illustratively mounted over the transducer 130. The measurement and control circuit 140 measures the force applied by the user to the chassis, which is transmitted to the lower surface of the heat sink interface block 120. The measurement and control circuit 140 then provides an indication of the force being applied to the user, via the force indicators 150 (e.g., a plurality of light emitting diodes (LEDs)).

Figure 3:
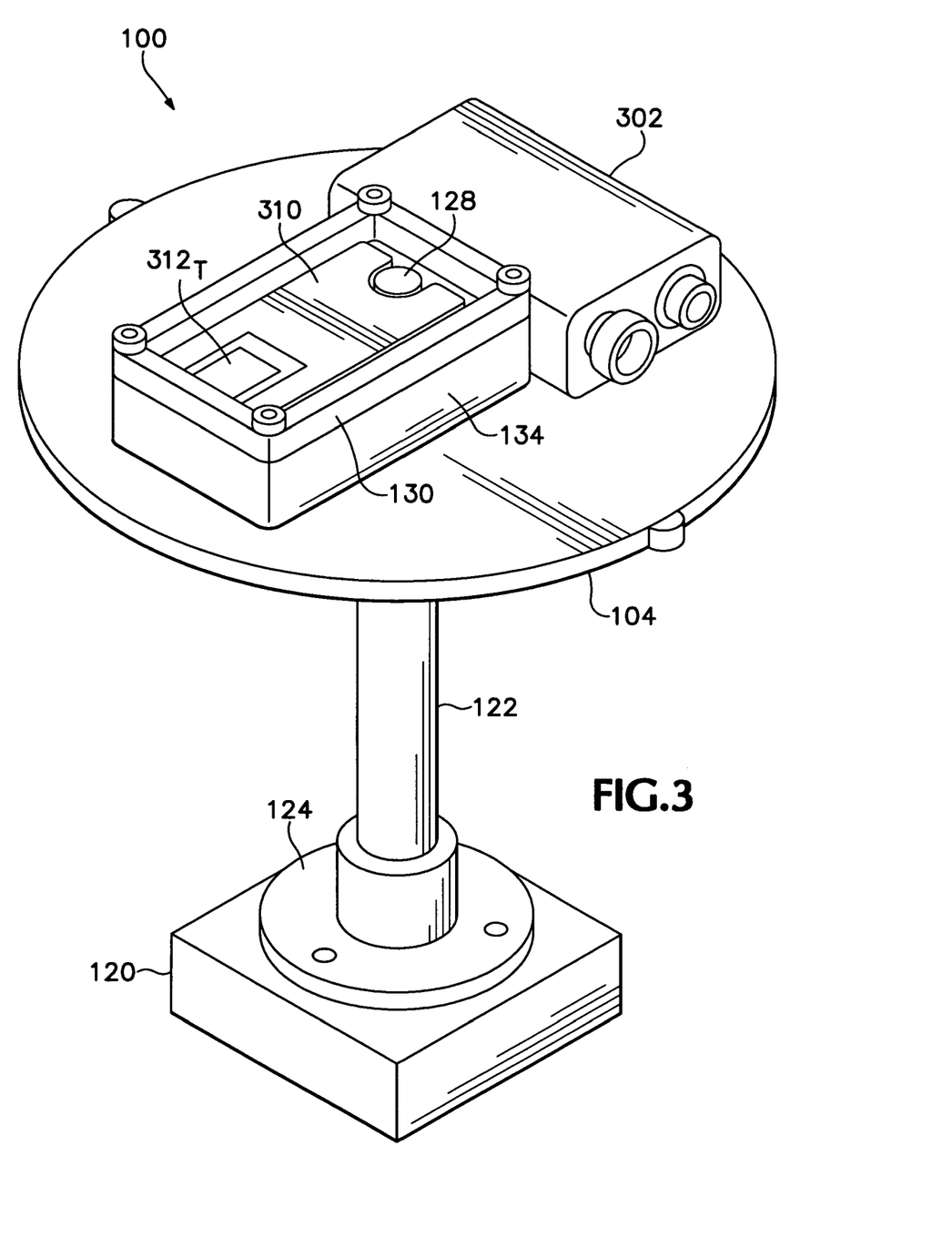
FIG. 3 depicts an isometric view of the internal structure of the heat sink tool of FIG. 1.

FIG. 3 depicts an isometric view of the internal structure of the heat sink hand placement tool of FIG. 1. In particular, the upper surface 106 and at least one sidewall 108 of the chassis 102 of FIG. 1 are not shown in FIG. 3. The lower plate 104 of the chassis 102 comprises an aperture (not shown) sized to accommodate the second end 128 of the extension rod 122 to slidably pass therethrough. The force transducer 130 is mounted to the lower plate 104 of the chassis 102 and circumscribes the second end 128 of the extension rod 122. In one embodiment, the force transducer 130 is mounted on a mounting base 134 to the lower plate 104 of the chassis 102. The mounting base 134 comprises an aperture 136 for facilitating routing a plurality of wire leads 132 from the force transducer 130 to the measurement and control circuit 140 mounted above. One skilled in the art will appreciate that the force transducer 130 and mounting base 134 may be an integral structure mounted to the lower plate 104 of the chassis 102. It is also noted that a battery 302, such as a nine-volt battery is also seated on the lower plate 104 of the chassis 102. The battery 302 provides power to the measurement and control circuit 140, as discussed below in further detail with respect to FIGS. 6 and 7.

In one embodiment, the force transducer 130 comprises a cantilever beam 310 having a pair of resistive strain gauges 312 affixed on opposing sides of the cantilever beam 310. As shown in FIG. 3, a top strain gauge $312_T$ is affixed to the top surface of the cantilever beam 310. Similarly, a bottom strain gauge (not shown) is affixed to the bottom surface of the cantilever beam 310. The second end 128 of the extension rod 122 is pivotally attached substantially perpendicular to the cantilever beam 310 via a pin joint (as illustratively shown in FIG. 5). As the cantilever beam 310 deflects under a load, the deflection alternately stresses and compresses the strain gauges 312, thereby causing variations in electrical resistance. As discussed below in further detail, each of the strain gauges 312 function as a resistive element in a wheatstone bridge (not shown) in the measurement and control circuit 140, which is used to produce a voltage signal that is subsequently used to provide an indication that the force is within a predetermined range. Thus, the force transducer 130 serves as an interface to convert the mechanical motion of the cantilever beam 310 to an electrical signal, which is sent to the measurement and control circuit 140.

Figure 4:
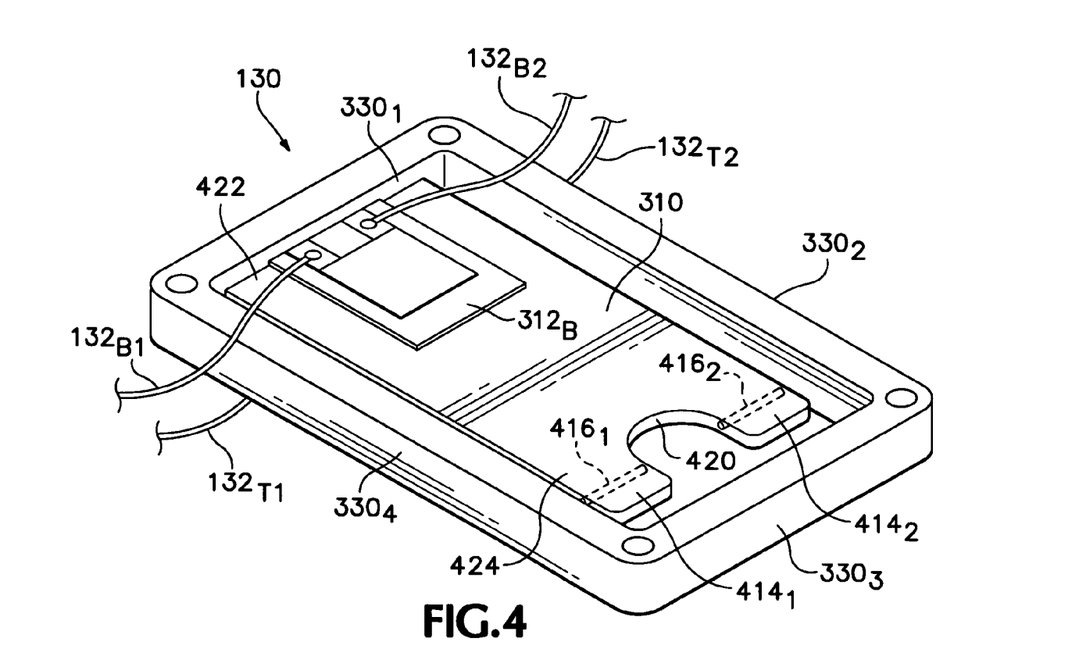
FIG. 4 depicts an isometric top view of a force transducer suitable for use in the heat sink tool of FIG. 1.
Figure 5:
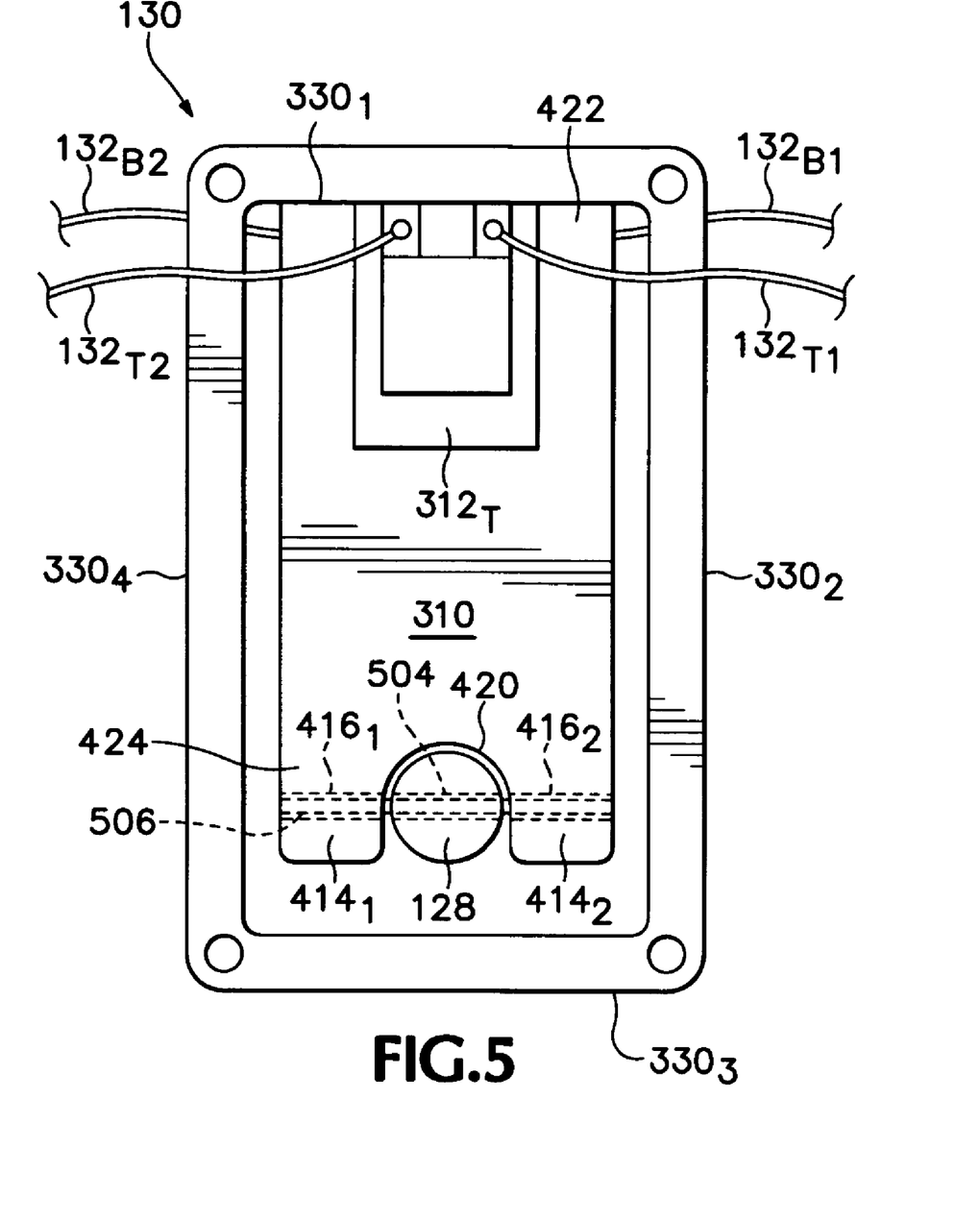
FIG. 5 depicts a top view of the force transducer of FIG. 4.

FIG. 4 depicts an isometric bottom view of a force transducer 130 suitable for use in the heat sink tool 100 of FIG. 1. FIG. 5 depicts a top view of a force transducer 130 of FIG. 4 with an extension rod 122 in place. For a better understanding of the invention, FIGS. 4 and 5 should be viewed in conjunction with FIG. 3.

Referring to FIG. 4, the force transducer 130 comprises at least one sidewall 330, and in the embodiment shown herein, the force transducer 130 is substantially rectangular having four sidewalls $330_1$ through $330_4$ (collectively, sidewalls 330). As shown in FIGS. 4 and 5, a first end 422 of the cantilever beam 310 is integrally formed to an inner surface of sidewall $330_1$. For example, the force transducer may be machined out of a solid block of aluminum, such that all the material is removed around the cantilever, except by the inner sidewall $330_1$. Alternatively, the cantilever beam 310 may be affixed to the inner surface of the sidewall $330_1$ by a fastener (e.g., bonding material, among others).

A second end 424 of the cantilever beam 310 extends from the inner surface of the first sidewall $330_1$, proximate an inner surface of an opposing sidewall, e.g., sidewall $330_3$. The second end 424 of the cantilever beam 310 serves as an interface to the second end 128 of the extension rod 122.

In particular, the second end 424 of the cantilever beam 310 comprises a pair of tongs $414_1$ and $414_2$, which form a U-shaped gap 420 sized to circumscribe a portion of the second end 128 of the extension rod 122, as illustratively shown in FIG. 5. In one embodiment, the sidewalls 330, the cantilever 310, and pair of tongs 414 are fabricated from aluminum, such as 2024 Aluminum T-351, where the cantilever beam 310 and tongs 414 have a thickness of approximately $\frac{1}{16}$". It is noted that the thickness of the cantilever 310 and tongs 414 depend on the type of material used to fabricate the transducer 130, as well as the desired flexibility of the cantilever 310.

As shown in FIGS. 4 and 5, a pair of bores $416_1$ and $416_2$ traverse through each of the respective tongs $414_1$ and $414_2$. The bores $416_1$ and $416_2$ are axially aligned and extend perpendicular to the second end 424 of the cantilever beam 310. That is, the tong bores $416_1$ and $416_2$ extend laterally between the upper and lower surfaces of the cantilever beam 310 and parallel to the sidewall $330_3$. Accordingly, the tong bores 416 have a diameter less than the thickness of the cantilever beam 310 and tongs 414, and are sized to accommodate a retainer pin 506, as discussed below with respect to FIG. 5.

Referring to FIG. 5, an extension rod bore 504 is formed in the second end 128 of the extension rod 122. In particular, the extension rod bore 504 is formed perpendicular to the length of the extension rod 122 and is sized to accommodate the retention pin 506 therethrough. The second end 128 of the extension rod 122 is positioned in the U-shaped tong gap 420 between the tongs $414_1$ and $414_2$ such that the tong bores $416_1$ and $416_2$ and the extension rod bore 504 are axially aligned. Once the tong bores 416 and extension end bore 504 are axially aligned, the retainer pin 506 is inserted through the bores 416 and 504, thereby forming a pin joint.

Thus, the retainer pin 506 secures the second end 128 of the extension rod 122 to the transducer 130, thereby preventing the extension rod 122 from sliding out of the chassis 102 of the heat sink tool 100. Furthermore, the pin joint formed by the retention pin 506 allows the extension rod 122 to remain substantially perpendicular with respect to the lower plate 104 of the chassis 102 as the extension rod 122 slidably moves up and down when a force is exerted and withdrawn during usage of the tool 100. That is, when the user exerts a force on the knob 110 or chassis 102, the extension rod 122 moves upwards toward the hand of the user, thereby forcing the cantilever beam 310 to also move upward. Since the tongs 414 of the cantilever beam 310 and the second end 128 of the extension rod 122 both pivot around the retention pin 506, the extension rod 122 is able to maintain a substantially perpendicular alignment with respect to the lower plate 104 of the chassis 102. Additionally, the pin joint allows the transmission of torque from the chassis 102 to the extension rod 122, and ultimately to the heat sink interface block 120.

As discussed above, the force transducer 130 converts mechanical motion into an electrical signal (i.e., voltage). Such conversion from a mechanical input to an electrical output is provided by a pair of strain gauges $312_B$ and $312_T$, which are affixed to the bottom and top surfaces at the first end 422 of the cantilever beam 310.

Referring to FIG. 4, the bottom strain gauge $312_B$ is bonded (illustratively using a bonding material (e.g., LOC-TITE 496 "Super Bonder", among other glues and bonding materials), to the bottom surface of the cantilever beam 310. More specifically, the bottom strain gauge $312_B$ is bonded on the surface and at the first end 422 of the cantilever beam 310, proximate the inner wall of the first sidewall $330_1$. A pair of leads $132_{B1}$ and $132_{B2}$ is coupled to the bottom strain gauge $312_B$, illustratively, by soldering one end of the bottom leads $132_B$ to solder pads formed on the bottom strain gauge $312_B$.

Referring to FIG. 5, the top strain gauge $312_T$ is affixed to the upper surface of the cantilever beam 310 in the same manner as described for the bottom strain gauge $312_B$ as discussed with respect to FIG. 4. In particular, the top strain gauge $312_T$ is bonded on the surface and at the first end 422 of the cantilever beam 310, proximate the inner surface of the first sidewall $330_1$. A pair of upper wire leads $132_{T1}$ and $132_{T2}$ (collectively upper wire leads $132_T$) are coupled to the upper strain gauge $312_T$, illustratively, by soldering an end of each top lead $132_{T1}$ and $132_{T2}$ to a respective solder pad on the upper strain gauge $312_T$. The opposing ends of the bottom wire leads $132_B$ and top wire leads $132_T$ are then coupled to the measurement and control circuitry 140, as shown in FIG. 1.

Accordingly, the exemplary force transducer 130 has been shown and discussed as having a cantilever beam 310 interfacing with a second end 128 of the extension rod 122, and a pair of strain gauges 312 for producing electrical signals from deflections of the cantilever beam 310. However, a person skilled in the art would appreciate that other types of transducers may also be utilized to convert mechanical motions to electrical signals. Such alternative force transducers may include load cells utilizing piezoelectric crystals, semiconductor strain gauges, thin-film strain gauges, and various sensing devices that utilize elastic materials or magnetism, among others.

Figure 6:
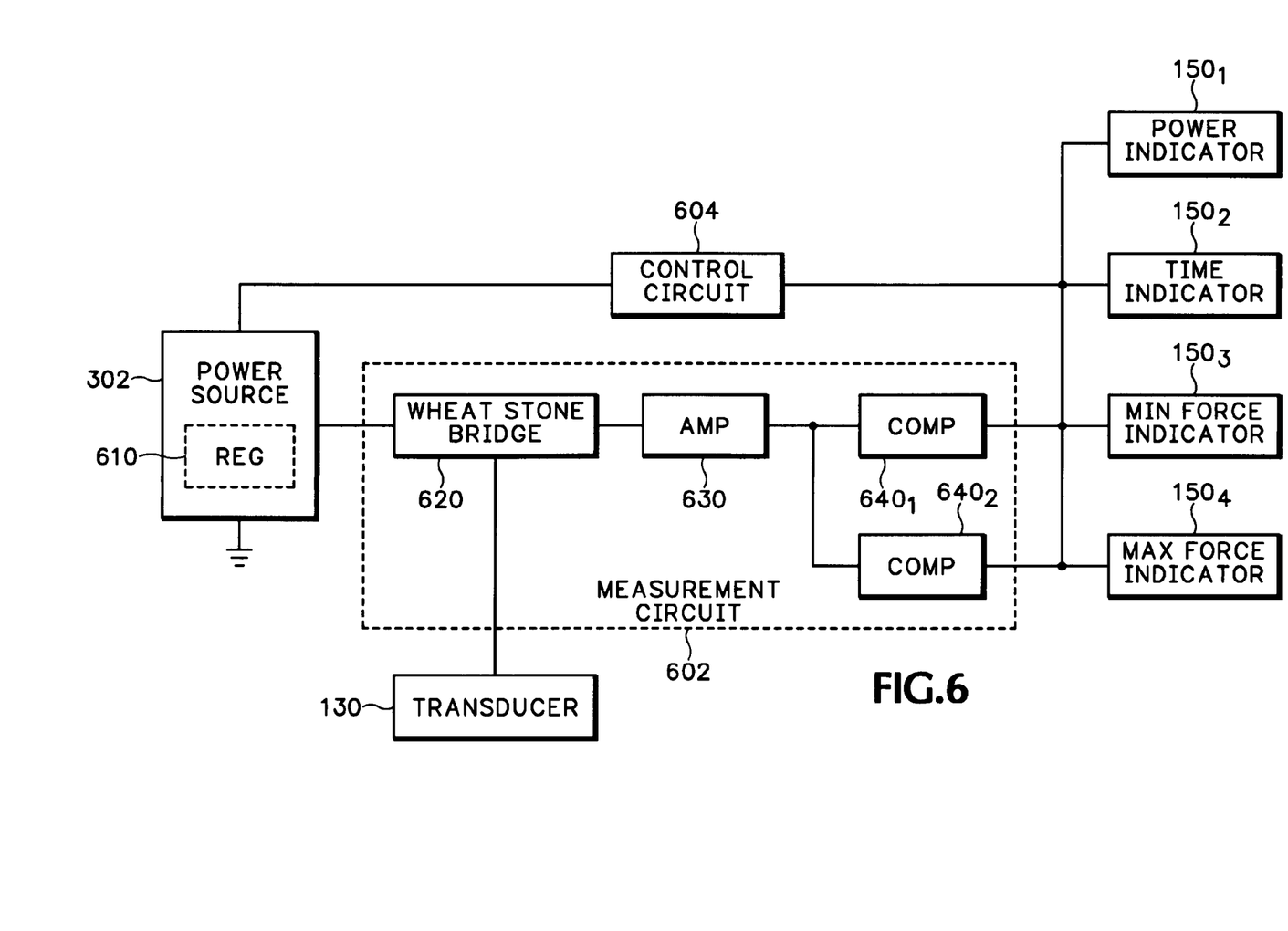
FIG. 6 depicts a block diagram of a measurement and control circuit suitable for use in the heat sink tool of FIG. 1.

FIG. 6 depicts a schematic diagram of a measurement and control circuit 140 suitable for use in the heat sink hand placement tool 100 of FIG. 1. The measurement and control circuit 140 comprises a measurement circuit 602 and a control circuit 604, where the measurement circuit 602 receives electrical signals from the force transducer 130 and produces output signals to the plurality of the LED's 150, which indicate when a minimum predetermined force is being applied to the tool 100 and when a maximum predetermined force is being exceeded. Furthermore, the control circuit 604, which is connected to the measurement circuit 602, manages the measurement circuit 602 to limit the overall power usage. That is the measurement circuit 602 is responsible for measuring the applied force, while the control circuit 604 is responsible for switching the measurement circuitry 602 on and off.

Referring to FIG. 6, the measurement circuit 602 and control circuit 604 are coupled to a power source 302, such as a battery, (e.g., 9-volt battery) to provide power to the measurement and control circuit 140. The power source 302 may optionally comprise a regulator 610, such as a voltage regulator, to step up or down the supply voltage to the measurement circuit 602 and/or control circuit 604.

In one embodiment, the measurement circuit 602 comprises a wheatstone bridge 620, an amplifier 630, and a first and second comparator $640_1$ and $640_2$. The Wheatstone bridge 620 has an input coupled to the power source 302, and comprises the resistive strain gauges $312_B$ and $312_T$ of the transducer 130. As discussed above with respect to FIGS. 4 and 5, as well below with respect to FIG. 7, the top and bottom strain gauges $312_T$ and $312_B$ form a portion of the Wheatstone bridge 620. That is, each strain gauge 312 has a predetermined resistive value (e.g., 350 ohms) that changes in resistance when the cantilever beam 310 deflects, as is conventionally known in the art. The changes in resistance of the strain gauges 312 in the Wheatstone bridge 620 produce an output voltage differential, which is optionally amplified by the amplifier 630. The amplified voltage signal is coupled to the two comparators $640_1$ and $640_2$. Each comparator compares the magnitude of the amplified voltage to a predetermined threshold value.

For example, the first comparator $640_1$ has a first predetermined voltage threshold value representing a minimum force (e.g., five lbs.) that is suitable for exerting on the heat sink tool 100 to secure the heat sink to the IC. Similarly, the second comparator $640_2$ has a second predetermined voltage threshold value representing a maximum force (e.g., eight lbs.) that is suitable for exerting on the heat sink tool 100 to secure the heat sink to the IC. In an instance where the exerted force exceeds the first predetermined voltage threshold value, the first comparator $640_1$ sends an output signal to a minimum force indicator $150_3$, such as an exemplary green LED. It is noted that the exemplary green LED $150_3$ does not turn on until the first predetermined voltage threshold is exceeded.

Similarly, in an instance where the exerted force exceeds the second predetermined voltage threshold value, the second comparator $640_2$ sends an output signal to a maximum force indicator $150_4$, such as an exemplary red LED. It is noted that the exemplary red LED $150_4$ does not turn on until the second predetermined voltage threshold is exceeded.

The control circuit 604 provides various enhancement functions. For example, the control circuit is coupled to a power indicator $150_1$ (e.g., a blue LED) to indicate if the illustrative battery 302 has a voltage potential below a predetermined battery level threshold value. For example, if the power source comprises a 9-volt battery 302, the predetermined battery level threshold value may illustratively be set to 7-volts, to indicate that a replacement battery will soon be required.

A second enhancement provided by the control circuit 604 is to indicate that the force exerted by the tool on the heat sink has been applied for a time period suitable to properly secure the heat sink onto the IC. That is, even though a user has applied a force between 5 and 8 pounds, such force should be applied for some predetermined time to ensure the heat sink properly adheres to the IC. In one embodiment, the control circuit 604 comprises a clock and counter (not shown), where the counter is coupled to a time indicator $150_2$ (e.g., a yellow LED) to indicate that the minimum force (e.g., 5 lbs.) has been applied for at least five seconds.

Figure 7:
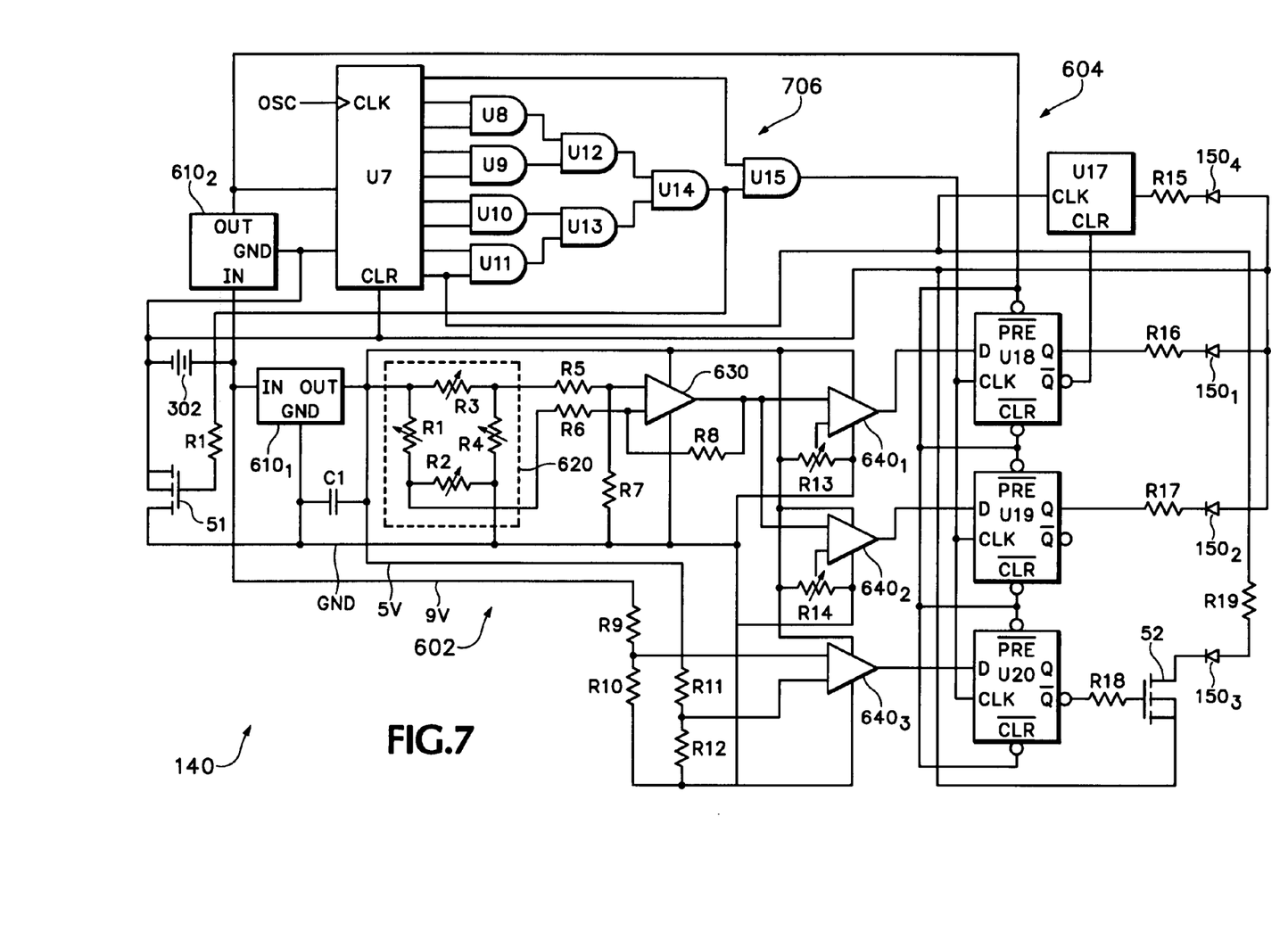
FIG. 7 depicts a schematic diagram of an exemplary measurement and control circuit suitable of FIG. 6.

FIG. 7 depicts a schematic diagram of an exemplary measurement and control circuit 140 suitable for use in FIG. 6. The measurement circuit 602 comprises a first voltage regulator $610_1$, a wheatstone bridge 620, an operational amplifier 630, a first comparator $640_1$, a second comparator $640_2$, and a third comparator $640_3$. In particular, the exemplary 9-volt battery 302 is coupled to an input of the first voltage regulator $610_1$, which produces a voltage output, illustratively, of five-volts. The output of the five-volt regulator $610_1$ is coupled to the input of the Wheatstone bridge 620, which comprises the pair of strain gauges $312_T$ and $312_B$. The two strain gauges $312_T$ and $312_B$, as represented by resistors R3 and R4 in FIG. 7, together produce a voltage difference when the cantilever beam 310 deflects during use of the tool 100.

The output of the Wheatstone bridge 620 is amplified by the op-amp 630 illustratively having a gain of approximately one hundred (100). The output of the op-amp 630 forms an input for the first and second comparators $640_1$ and $640_2$. The first and second comparators $640_1$ and $640_2$ are provided with predetermined threshold values respectively corresponding to a five-pound force and an eight-pound force being applied. The outputs of the first and second comparators $640_1$ and $640_2$ are respectively coupled to first and second LEDs $150_1$ and $150_2$. The first comparator $640_1$ turns on the first LED $150_1$ when the voltage to the first comparator $640_1$ exceeds the first predetermined threshold value (e.g., a voltage corresponding to 5-lbs pressure). Similarly, the second comparator $640_2$ turns on the second LED $150_2$ when the voltage to the first comparator $640_1$ exceeds the second predetermined threshold value (e.g., a voltage corresponding to 8-lbs pressure).

The third comparator $640_3$ is used to check the voltage of the battery 302. The third comparator $640_3$ also has a third predetermined threshold value, which triggers a low battery indicator $150_3$. The output of the third comparator $640_3$ is coupled to the low battery indicator (e.g., a third LED) $150_3$. The third comparator $640_3$ turns on the third LED $150_3$ when the voltage to the third comparator $640_3$ exceeds the third predetermined threshold value (e.g., a voltage corresponding to 7-volts for a 9-volt battery 302).

Referring to the measurement circuit 602 of FIG. 7, the positive terminal of a nine-volt battery 302 is coupled to an input of the first five-volt regulator $610_1$, while the negative terminal of battery 302 is coupled to ground. The five-volt regulator $610_1$, which is also coupled to ground, produces a five-volt output that is coupled to the Wheatstone bridge 620.

The Wheatstone bridge 620 comprises a first fixed resistor R1 having a first end coupled to the five-volt output of the voltage regulator 610 at node-B, and a second end coupled to a first end of a second fixed resistor R2 at node-C. The second end of the second fixed resistor R2 is coupled to ground at node-D. A first end of a third variable resistor R3 is coupled to the five-volt output of the voltage regulator 610 at node-B, while a second end of the third resistor R3 is coupled to a first end of a fourth variable resistor R4 at node-A. The second end of the fourth variable resistor is then coupled to the second end of the second fixed resistor R2 at node-D.

As mentioned above, the third and fourth variable resistors R3 and R4 illustratively represent the top and bottom strain gauges $312_T$ and $312_B$. Thus, wire lead $132_{T1}$ is illustratively coupled to the five-volt output of the voltage regulator 610 at node-B, while wire lead $132_{T2}$ and wire lead $132_{B1}$ of the bottom strain gauge $312_B$ are both coupled at node-A. Furthermore, the wire lead $132_{B2}$ of the bottom strain gauge $312_B$ is coupled to the second end of the second fixed resistor R2 and ground at node-D.

The values of the fixed resistors R1 and R2 are selected to match the resistance value of the strain gauges 312 while in their static state. That is, when there is no force being exerted on the cantilever beam 310, the top and bottom strain gauges $312_T$ and $312_B$ remain static (i.e., do not compress and expand). In the exemplary embodiment shown herein, the conventional strain gauges 312 have a static resistive value of approximately 350 ohms. Accordingly, the fixed resistors R1 and R2 are also provided with a resistive value of 350 ohms.

The Wheatstone bridge 620 is used to generate a voltage signal in response to resistive changes in the strain gauges 312 (variable resistors R3 and R4). Any voltage differential generated by the Wheatstone bridge 620 is monitored by coupling the op amp 630 across nodes A and C. In particular, node-A is coupled to a first input of the op-amp 630 via resistor R5, while node-C is coupled to a second input of the op-amp 630 via resistor R6. It is noted that the first input of the operational amp of 630 is coupled to ground via resistor R7 (forming a voltage divider at the first input of the op-amp 630), while a resistor R8 provides a feedback loop from the output of the op-amp 630 to the second input of the op-amp 630.

The output of the op-amp 630 is coupled to the first inputs of the first and second comparators $640_1$ and $640_2$. The second inputs of the first and second comparators $640_1$ and $640_2$ are coupled to ground via variable resistors R13 and R14, respectively.

During operation, if a force is exerted on the tool 100 such that the cantilever beam 310 deflects upward, the top strain gauge $312_T$ measures a decrease in resistance on the upper surface of the cantilever beam 310, while the bottom strain gauge $312_B$ measures an increase in resistance on the lower surface of the cantilever beam 310. The changes in resistance, that is, to variable resistors R3 and R4, produces a voltage output signal that is subsequently amplified (e.g., β=100) by the op-amp 630 (e.g., 3.0 volts) and sent to the first and second comparators $140_1$ and $140_2$. As discussed above, once the first predetermined voltage threshold (e.g., 2.0 volts) is exceeded, the first comparator $140_1$ goes to a high state, thereby turning on the first LED $150_1$. Further, if the second predetermined voltage threshold (e.g., 2.5 volts) is exceeded, the second comparator $140_2$ then goes to a high state, thereby turning on the second LED $150_2$ as well.

Once the force has been reduced to a level corresponding to a voltage below the predetermined voltage thresholds, the LEDs 150 are turned off. Further, once the force has been completely removed, the strain gauges 312 return to their static resistive values (e.g., 350 ohms), and stop generating a voltage difference between nodes A and C.

The third comparator $640_3$ is used to check the voltage of the battery 302. The third comparator $640_3$ has an input coupled to the battery 302 via a voltage divider comprising resistors R9 and R10. Furthermore, a second input of the third comparator $640_3$ is coupled to the five-voltage line from the first voltage regulator $610_1$ via a second voltage divider comprising resistors R11 and R12. Once the third predetermined voltage threshold is exceeded, the third comparator $140_3$ illustratively goes into a high state, thereby turning on the third LED $150_3$.

As mentioned above, the control circuit 604 enhances the features of the present invention. The outputs of the first, second, and third comparators $640_1$, $640_2$, and $640_3$ are respectively coupled to the inputs of D type flip-flops U18, U19, and U20, which have their respective outputs coupled to the LEDs $150_1$, $150_2$, and $150_3$ via resistors R16, R17, and R18. The control circuit 604 controls the clock inputs of each of the flip-flops U18, U19, and U20.

Specifically, one advantage of the control circuit 604 is to prevent the measurement circuit from quickly draining the battery 302. That is, the control circuit 604 turns the measurement circuit 602 on only when a measurement is being taken, and then turns the measurement circuit 602 off when not used.

The control circuit 604 comprises a clock OSC (e.g., 50 kHz clock) coupled to an input of a counter U7, which provides a 9-bit output to an 8-bit input AND gate 706, which is represented by AND gates U8 through U15. It is noted that a second voltage regulator $610_2$ is coupled from the battery 302 to the counter U7 and ground. However, one skilled in the art will appreciate that a single voltage regulator 610 may be utilized to regulate the voltage for both the measurement circuit 602 and the control circuit 604.

As illustratively shown in FIG. 7, Boolean logic is performed by U8 for the counter output bits 2 and 3, by U9 for counter output bits 4 and 5, by U10 for counter output bits 6 and 7, and U11 for counter output bits 8 and 9. The outputs U8 and U9 are coupled to the inputs of AND gate U12, while the outputs of U10 and U11 are coupled to the inputs of U13. The outputs of U12 and 13 are coupled to the input of AND gate U14. The output of U14 is coupled to a first switch S1 (e.g., an insulated gate bipolar transistor (IGBT), among other switches), which is used to turn on and off the measurement circuit 602.

In particular, the drain of the IGBT is coupled to the negative terminal of the battery, the source is coupled to ground, and the gate is coupled to the output of U14. The output of U14 represents the state of the 8 most significant bits from counter U7. If the output of U14 is high (i.e., all 8-bits are 1's), the gate of IGBT goes high and turns on the IGBT, thereby coupling the negative terminal of the battery 302 to ground to turn on the measurement circuit 602.

Further, the output of U14 and the least significant bit (e.g., bit-1) output from the counter U7 are coupled to the input of the AND gate U15. The output of U15 is then coupled to the clock inputs ("CLK") of the flip-flops U18, 19, and U20.

The measurement circuit 602 maintains the state of the first, second and third comparators $640_1$–$640_3$ when the output of the 8 input AND gate 706 (i.e., output of U15) goes into a high state (1). In particular, the output state of the comparators U4, U5, and U6 are respectively captured by the D-type flip-flops U18, U19, and U20. The flip-flops are triggered by the output of the AND gate U15 and the output of the ninth bit (i.e., bit 1) of the counter U7.

During operation, when the clock input of the flip-flop goes into a high state from the output of the AND gate U15 (i.e., all 9-bits are in a high state), the flip-flop is opened and the value from the output of the respective comparator 640 is stored in the data input "D" of the flip-flop. Furthermore, the Q-output assumes the same state as the input D. When the clock is disserted, the flip-flop is closed and the Q-output remains in the same state as the last time the flip-flop was open.

Referring to comparator $640_1$, U18, and LED $150_1$ of FIG. 7, which illustratively represent the indication circuitry with respect to a 5-lb. force being applied to the tool 100, when the output of the 8-bit AND gate U15 goes high, the clock of the first flip-flop U18 also goes high. Accordingly, the D input of the flip-flop U18, changes to the state of the output of the comparator $640_1$. Moreover, the Q-output of the first flip-flop U18 assumes the state of the D input. Thus, if the output of the comparator $640_1$ is in a high state (i.e., a force of at least 5-lbs. is being applied to the tool 100), then the LED $150_1$ will turn on.

A similar analysis may be performed regarding the 8-lb. force indicator $150_2$ with respect to comparator U5 flip-flop, U19, and LED $150_2$. That is, when the clock of the second flip-flop U19 goes into a high state, the data input changes to the state of the output of the second comparator $640_2$, and the Q-output assumes a state of the data input of the flip-flop U19. When the Q-output is in a high state, the exemplary red LED $150_2$ is turned on, thereby indicating that a force that is greater than 8-lbs. has been exceeded by the user.

An exemplary blue LED $150_3$ is illuminated when the battery 302 drops below seven-volts. Recall that in the exemplary embodiment shown in FIGS. 3 through 6, a nine-volt battery 302 is utilized to power the measurement and control circuit 140. That is, the third comparator $640_3$ provides a high state output to the data input of the flip-flop U20 in an instance where the nine-volt battery potential drops below seven-volts. When the clock of the flip-flop U20 goes into a high state, the output of the comparator $640_3$ changes the state of the data line. Furthermore, the Q-output assumes the opposite state of the data line input "D", thereby turning on the exemplary blue LED $150_3$. It is noted that by coupling the output of the AND gate U15 to the clock of the flip-flop U20, the LED $150_3$ will blink as the output of the AND gate U15 alternates between high and low states.

Additionally, a yellow LED $150_4$ is provided to indicate that the force has been applied for a sufficient time. In one embodiment, the yellow LED $150_4$ indicates that the force has been held for at least five seconds. Referring to FIG. 7, an output of the first flip-flop U18 is coupled to a second counter U17, which has an output coupled to the yellow LED $150_4$ through resistor R15. The first flip-flop U18 operates in conjunction with the first comparator $640_1$, which illustratively goes into a high state when a 5-pound pressure has been exerted on the tool 100. When the output of the first flip-flop U18 goes high, the counter U17 is cleared and begins counting clock cycles. Once five seconds has elapsed, an output voltage of the counter U17 switches to a high state and turns on the yellow LED $150_4$. When the force is removed from the tool 100, the control circuit 604 turns off the measurement circuit 602 and all of the LEDs 150.

It is noted that the force, battery, and duration indicators 150 have been described as being color-coded LEDs. However, other embodiments may include fiber optics, or any other light-producing element. Furthermore, the indicators 150 may include or alternatively be a sound device, produced from a mechanical or digital sound-producing device (e.g., speaker, wave file, among others).

It is noted that other embodiments of the measurement and control circuitry 140 may include using a micro-controller, a microprocessor, or other solid state computing devices to accomplish the measurement and control. Moreover, the comparators 640 discussed with respect to FIGS. 6 an 7 may include window comparators, operational amplifiers, or any other circuitry capable of comparing at least two input signals and producing an output signal in response.

The inventive heat sink hand placement tool shown and described herein allows a user to manually attach a heat sink to an IC with limited variability in the force and duration that the force is applied. The heat sink tool is portable, ergonomically friendly to users, simple to use, and is ESD safe. Moreover, the heat sink hand placement tool provides a consistent magnitude and duration of the force applied to the heat sink, thereby reducing the variability problems discussed herein with respect to the prior art.

Although various embodiments that incorporate the teachings of the present invention have been shown and described in detail herein, those skilled in the art can readily devise many other varied embodiments that still incorporate these principles.

What is claimed is:

1. A heat sink hand placement tool, comprising:
   a heat sink interface block having a lower surface adapted to provide a force on a heat sink disposed over an integrated circuit (IC);
   a force transducer interfacing with an upper surface of said heat sink interface block for producing an electrical signal;
   a measurement circuit for measuring said electrical signal; and
   a chassis disposed over said force transducer and said measurement circuit, wherein said chassis is adapted to receive a force from a user, said force being transmitted to said lower surface of said heat sink interface block, and said measurement circuit provides an indication of said force being within a predetermined range.

2. The tool of claim 1 further comprising an extension rod having a first end coupled to said upper surface of said heat sink interface block and a second end coupled to said force transducer.

3. The tool of claim 2 wherein said force transducer comprises:
   a cantilever beam interfacing with said second end of said extension rod;
   at least one strain gauge coupled to said cantilever for producing said electrical signal in response to said cantilever beam deflecting from said force.

4. The tool of claim 3, wherein said force transducer further comprises:
   a mounting member;
   said cantilever beam having a first end and a second end, said first end flexibly coupled to said mounting member; and
   said at least one strain gauge comprises a pair of strain gauges, each strain gauge respectively attached on opposing sides of the first end of said cantilever beam proximate said mounting member.

5. The tool of claim 4, wherein the second end of said cantilever beam is U-shaped and circumscribes a portion of the second end of said extension rod.

6. The tool of claim 5, wherein the second end of said cantilever comprises:
   a pair of tongs circumscribing said portion of the second end of said extension rod; and
   a retainer pin extending through said pair of tongs and the second end of the extension rod, thereby forming a pin joint therebetween.

7. The tool of claim 6, wherein said the pin joint allows a transmission of torque applied at the chassis to the heat sink interface block, via the extension rod.

* * * * *